(12) United States Patent
Li

(10) Patent No.: US 11,266,013 B2
(45) Date of Patent: Mar. 1, 2022

(54) RIGID-FLEX PRINTED CIRCUIT BOARD AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventor: Wei-Xiang Li, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/029,364

(22) Filed: Sep. 23, 2020

(65) Prior Publication Data

US 2022/0030703 A1 Jan. 27, 2022

(30) Foreign Application Priority Data

Jul. 22, 2020 (CN) .......................... 202010712054.6

(51) Int. Cl.
| | |
|---|---|
| H05K 1/02 | (2006.01) |
| H05K 1/09 | (2006.01) |
| H05K 3/46 | (2006.01) |
| H05K 3/28 | (2006.01) |
| H05K 3/06 | (2006.01) |

(52) U.S. Cl.
CPC ......... *H05K 1/0277* (2013.01); *H05K 1/0216* (2013.01); *H05K 1/09* (2013.01); *H05K 3/06* (2013.01); *H05K 3/28* (2013.01); *H05K 3/4644* (2013.01); *H05K 2201/0715* (2013.01); *H05K 2203/0723* (2013.01)

(58) Field of Classification Search
CPC ...... H05K 1/0277; H05K 1/0216; H05K 3/28; H05K 3/4644; H05K 2201/0715
USPC ........................................................ 174/254
See application file for complete search history.

(56) References Cited

U.S. PATENT DOCUMENTS

| | | | | |
|---|---|---|---|---|
| 5,499,444 A | * | 3/1996 | Doane, Jr. ............ | H05K 3/4691 29/830 |
| 6,099,745 A | * | 8/2000 | McKenney .......... | H05K 3/4691 216/13 |
| 7,601,919 B2 | * | 10/2009 | Phan ..................... | H05K 3/4691 174/254 |

(Continued)

*Primary Examiner* — Sherman Ng
(74) *Attorney, Agent, or Firm* — ScienBiziP, P.C.

(57) ABSTRACT

A rigid-flex printed circuit board includes an inner circuit substrate, two adhesive sheet layers formed on the inner circuit substrate, two shielding structures, and two outer circuit layers. The inner circuit substrate is divided into a flexible area, a first and second rigid area. Each shielding structure includes a copper layer, a metal seed layer formed on the copper layer, a flexible dielectric layer formed on the metal seed layer, and a backing adhesive sheet layer formed on the flexible medium layer. The backing adhesive sheet layer is pressed on the adhesive sheet layer and the inner circuit substrate located in the flexible area. Each outer circuit layer is formed on the copper layer, located in the first rigid area and the second rigid area and electrically connected to the inner circuit substrate.

19 Claims, 6 Drawing Sheets

(56) References Cited

U.S. PATENT DOCUMENTS

2011/0094776 A1\* 4/2011 Lee .................. H05K 1/0218
                                                    174/254
2014/0096377 A1\* 4/2014 Park .................. H05K 3/4691
                                                    29/830

\* cited by examiner

RIGID-FLEX PRINTED CIRCUIT BOARD AND METHOD FOR MANUFACTURING THE SAME

FIELD

The subject matter of the application generally relates to a rigid-flex printed circuit board and a method for manufacturing the same.

BACKGROUND

The rigid-flex printed circuit boards are being used extensively within the printed circuit board industry. The rigid-flex printed circuit board includes a flexible area and at least one rigid area. A break is generated between the flexible area and the rigid area. When a shielding film of silver paste conductive cloth is formed on the flexible area and the rigid area of the rigid-flex printed circuit board, the shielding film may be at risk of being damaged. Furthermore, the bonding of the shielding film may requires manufacturing processes such as punching, pasting, pressing, tearing the protective film, and baking, all of which may increase a manufacturing cost of the shielding film. Outer layer circuits of the rigid-flex printed circuit board are formed by tenting process, which may not meet the requirements of the Co-design requirements of power supply (thick copper and high current) and signal processing (thin wire).

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
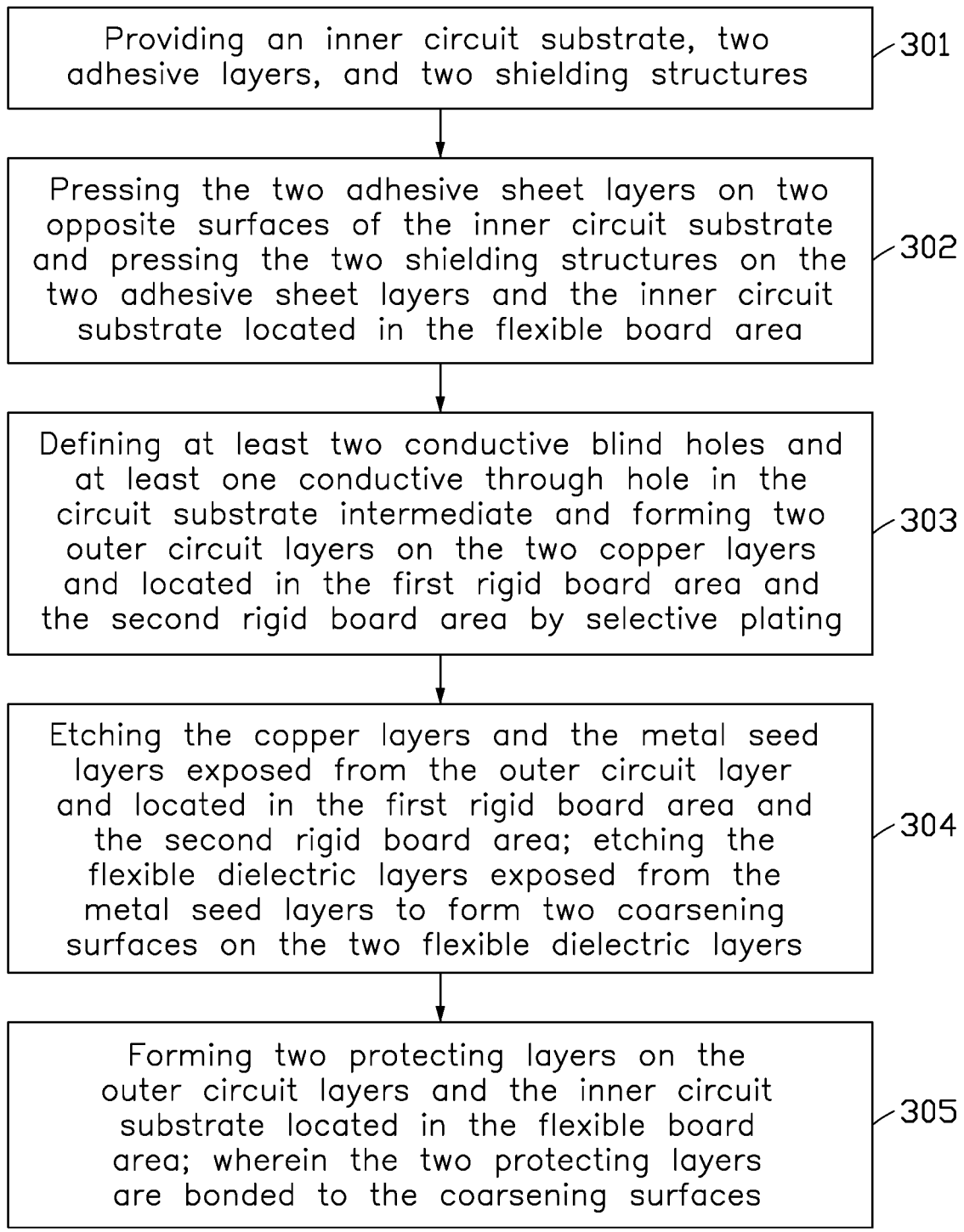
FIG. 1 is a flowchart of a method for manufacturing a rigid-flex printed circuit board in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

FIG. 1 illustrates a flow chart of a method for manufacturing a rigid-flex printed circuit board 100 in accordance with an embodiment of the present disclosure. The example method is provided by way of example, as there are a variety of ways to carry out the method. The method described below can be carried out using the configurations illustrated in FIGS. 2-10, for example, and various elements of these figures are referenced in explaining the example method. Each block shown in FIG. 1 represents one or more processes, methods, or subroutines, carried out in the example method. Additionally, the illustrated order of blocks is by example only and the order of the blocks can change. The example method can begin at block 301.

Figure 2:
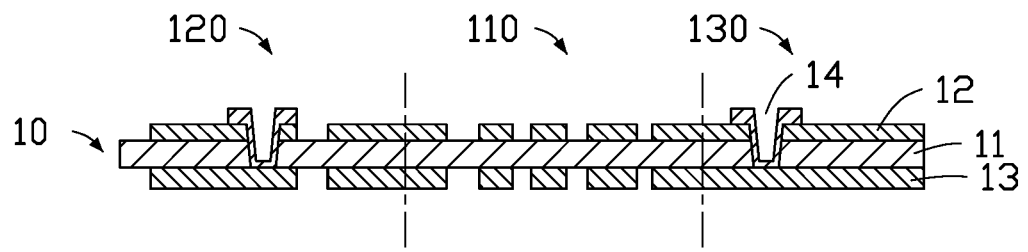
FIG. 2 is a cross-section view of an inner circuit substrate in a first embodiment according to the manufacturing method of FIG. 1.
Figure 3:
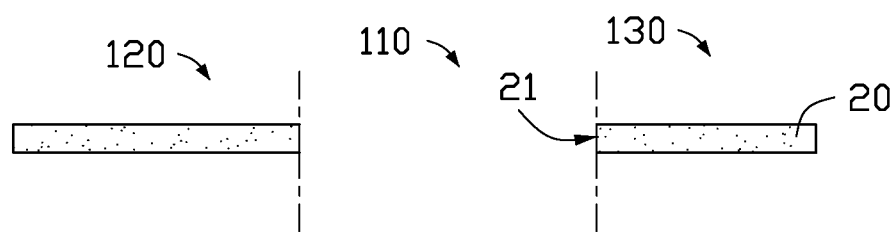
FIG. 3 is a cross-section view of an adhesive sheet layer in the first embodiment according to FIG. 1.
Figure 4:
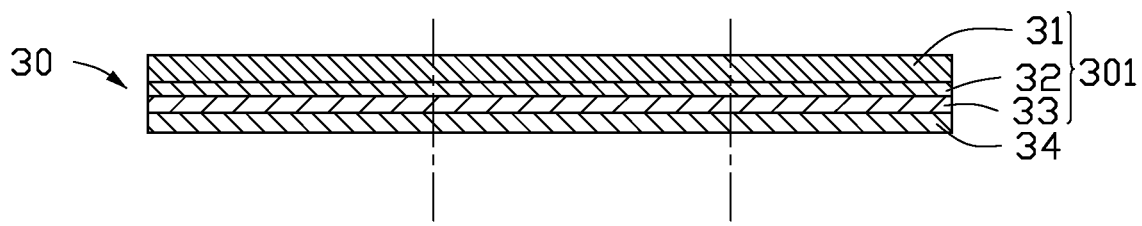
FIG. 4 is a cross-section view of a shielding structure in the first embodiment according to FIG. 1.

At block 301, referring to FIGS. 2-4, an inner circuit substrate 10, two adhesive sheet layers 20, and two shielding structures 30 are provided.

Referring to FIG. 2, the inner circuit substrate 10 is divided into a flexible area 110, a first rigid area 120, and a second rigid area 130. The first rigid area 120 and the second rigid area 130 are located on two ends of the flexible area 110.

In at least one embodiment, the inner circuit substrate 10 includes a substrate layer 11, a first inner circuit layer 12, and a second inner circuit layer 13. The first inner circuit layer 12 and the second inner circuit layer 13 are formed on two opposite surfaces of the substrate layer 11. The first inner circuit layer 12 includes at least one first inner circuit 121. The second inner circuit layer 13 includes at least one second inner circuit 131.

In other embodiments, the inner circuit substrate 10 may further include more substrate layers and inner circuit layers.

The substrate layer 11 is flexible. A material of the substrate layer 11 is selected from at least one of polyimide (PI), polyethylene terephthalate (PET), polyethylene naphthalate (PEN), polyethylene (polyethylene, PE), Teflon, liquid crystal polymer (LCP), polyvinyl chloride polymer (PVC), Ajinomoto Build-up Film (ABF), and other materials. In at least one embodiment, the material of the substrate layer 11 is PI.

The inner circuit substrate 10 further includes at least one conductive hole 14 electrically connected to the first inner circuit layer 12 and the second inner circuit layer 13. In at least one embodiment, the conductive hole 14 is a blind conductive hole and penetrates the first inner circuit layer 12 and the substrate layer 11. In other embodiments, the conductive hole 14 may also be a conductive through hole.

Referring to FIG. 3, a cavity 21 is defined at each adhesive sheet layer 20. The cavity 21 penetrates through the adhesive sheet layer 20 and is corresponding to the flexible area 110. In at least one embodiment, a material of the adhesive sheet layer 20 is polypropylene (PP).

Referring to FIG. 4, each of the shielding structure 30 includes a copper layer 31, a metal seed layer 32 formed on the copper layer 31, and a flexible dielectric layer 33 formed on the metal seed layer 32, and a backing adhesive sheet layer 34 formed on the flexible medium layer 33.

In at least one embodiment, a thickness of the copper layer 31 is 2 mm to 5 mm.

In at least one embodiment, a material of the metal seed layer 32 is selected from at least one of nickel, chromium, silver, and other metal target materials.

A material of the flexible dielectric layer 33 is selected from at least one of polyimide (PI), polyethylene terephthalate (PET), polyethylene naphthalate (PEN), polyethylene (polyethylene, PE), Teflon, liquid crystal polymer (LCP), polyvinyl chloride polymer (PVC), Ajinomoto Build-up Film (ABF), and other materials. In at least one embodiment, the material of the flexible dielectric layer 33 is PI.

A material of the backing adhesive sheet layer 34 may be at least one of resin materials with a good fluidity, such as thermoplastic polyimide (TPI).

Referring to FIG. 4, a method for manufacturing the shielding structure 30 is as follows: firstly, a single-sided copper-clad substrate 301 is provided. The single-sided copper-clad substrate 301 includes the copper foil layer 31, the metal seed layer 32, and the flexible medium layer 33. Secondly, a backing adhesive is provided, the backing adhesive includes the backing adhesive sheet layer 34 and a release film formed on the backing adhesive sheet layer 34, the release film is removed from the backing adhesive sheet layer 34, and the backing adhesive sheet layer 34 is pasted on a surface of the flexible medium layer 33 away from the metal seed layer 32 to obtain the shielding structure 30.

Figure 5:
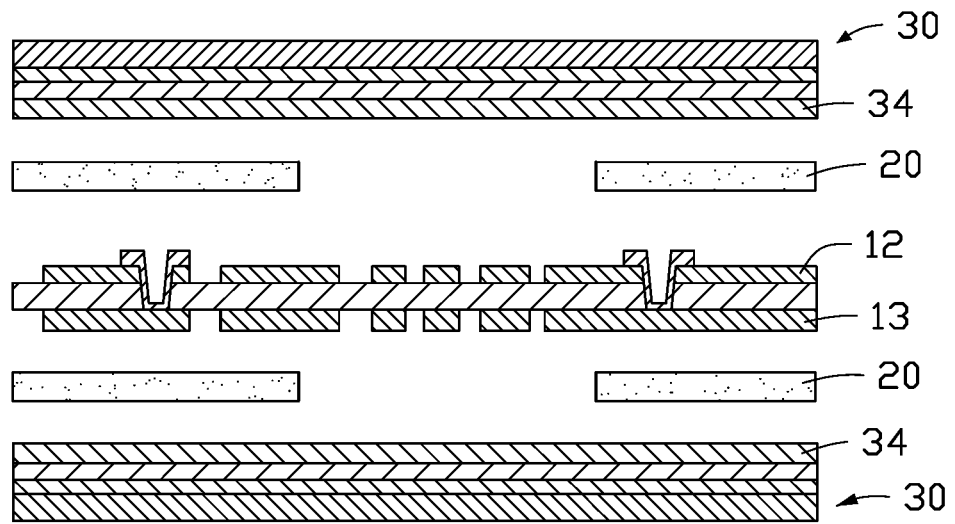
FIG. 5 is a cross-section view wherein the shielding structure of FIG. 4, the adhesive sheet layer of FIG. 3, the inner circuit substrate of FIG. 2, an additional one of the adhesive sheet layer of FIG. 3, and an additional one of the shielding structure of FIG. 2 are stacked together.
Figure 6:
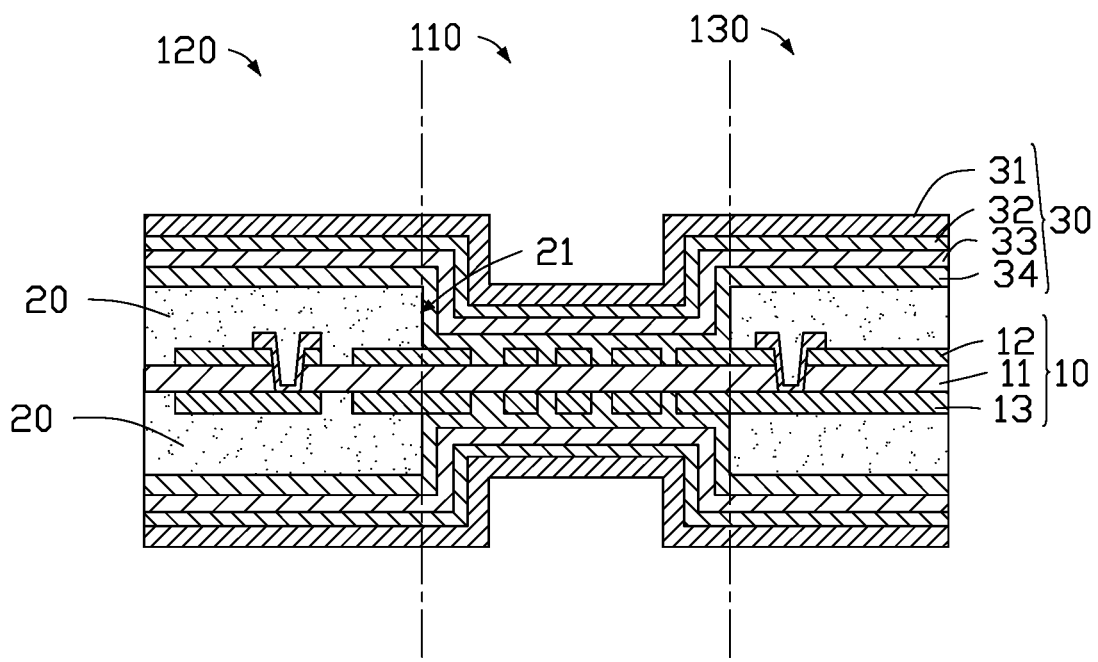
FIG. 6 is a cross-section view showing two of the adhesive sheet layers of FIG. 5 are pressed on two opposite surfaces of the inner circuit substrate of FIG. 5, and the two shielding structures of FIG. 5 are pressed on the two adhesive sheet layers and the inner circuit substrate located in the flexible area.

At block 302, referring to FIGS. 5-6, the two adhesive sheet layers 20 are pressed on two opposite surfaces of the inner circuit substrate 10. The two shielding structures 30 are respectively pressed on the two adhesive sheet layers 20. The two shielding structures 30 further formed on two opposite surfaces of the inner circuit substrate 10 located in the flexible area 110.

In at least one embodiment, the adhesive sheet layers 20 is formed on the first inner circuit layer 12 and the second inner circuit layer 13 located in the first rigid area 120 and the second rigid area 130. The cavities 21 of the adhesive sheet layers 20 are located in the flexible area 110. The two backing adhesive sheet layers 34 are respectively pressed on the two adhesive sheet layers 20. The two backing adhesive sheet layers 34 are further respectively formed on the first inner circuit layer 12 and the second inner circuit layer 13 located in the flexible area 110. A portion of the backing adhesive sheet layer 34 further formed on an inner wall of the cavity 21 of the adhesive sheet layers 20.

In at least one embodiment, the backing adhesive sheet layer 34 is completely attached to the adhesive sheet layer 20 located in the first rigid area 120 and the second rigid area 130.

In other embodiments, the backing adhesive sheet layer 34 is partially attached to the adhesive sheet layer 20 located in the first rigid area 120 and the second rigid area 130.

Figure 7:
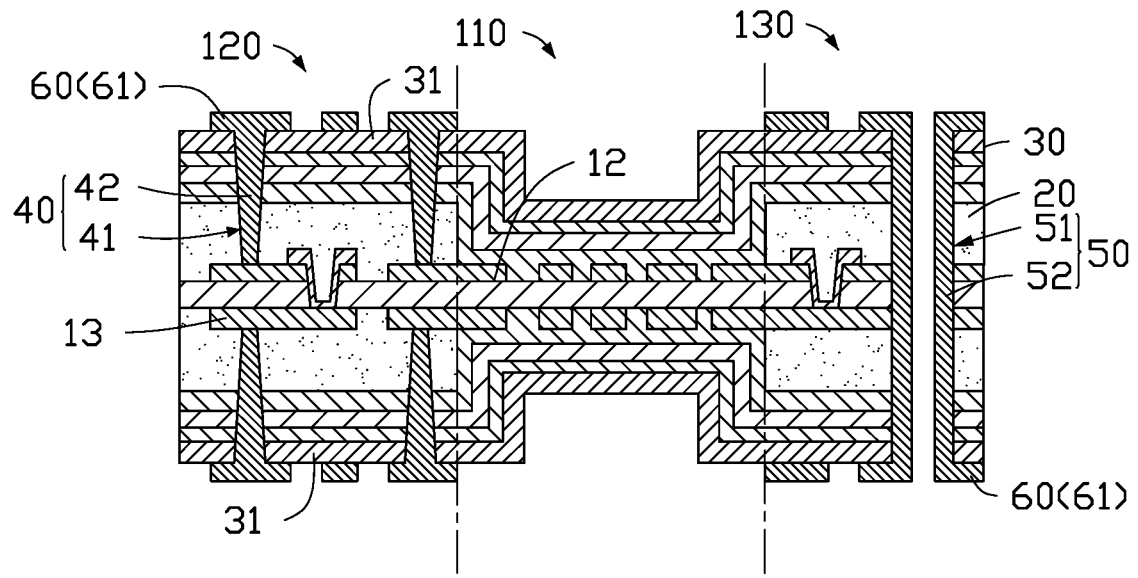
FIG. 7 is a cross-section view of forming an outer circuit layer on the shielding structure of FIG. 5 by selective electroplating and electrically connecting the outer circuit layer and the inner circuit substrate.

At block 303, referring to FIG. 7, at least two conductive blind holes 40 and at least one conductive through hole 50 are defined in the circuit substrate intermediate 140. Two outer circuit layers 60 are respectively formed on the two copper layers 31. The two outer circuit layers 60 are located in the first rigid area 120 and the second rigid area 130 by selective plating.

Firstly, at least two blind holes 41 and at least one through hole 51 are defined in the circuit substrate intermediate 140. Secondly, at least two first electroplated copper blocks 42 are respectively formed in the blind holes 41 by a selective electroplating and at least one second electroplated copper block 52 is formed in the through holes 51 by a selective electroplating.

One of the at least two blind holes 41 penetrates through one of the two adhesive sheet layers 20 and one of the two shielding structures 30. The through hole 51 penetrates through the two adhesive sheet layers 20 and the two shielding structures 30.

The blind hole 41 and the first electroplated copper block 42 formed in the blind hole 41 form a conductive blind hole 40. The conductive blind hole 40 is electrically connected to the outer circuit layer 60 and the first inner circuit layer 12 or the second inner circuit layer 13.

The through hole 51 and the second electroplated copper block 52 formed in the through hole 51 form a conductive through hole 50. The conductive through hole 50 is electrically connected to the two outer circuit layers 60.

The two outer circuit layers 60 are located in the first rigid area 120 and the second rigid area 130.

Each outer circuit layer 60 includes at least one outer circuit 61. A thickness of the outer circuit 61 is greater than that of the first inner circuit 121 or that of the second inner circuit 131. A density of the outer circuit 61 is greater than that of the first inner circuit 121 or that of the second inner circuit 131.

Figure 8:
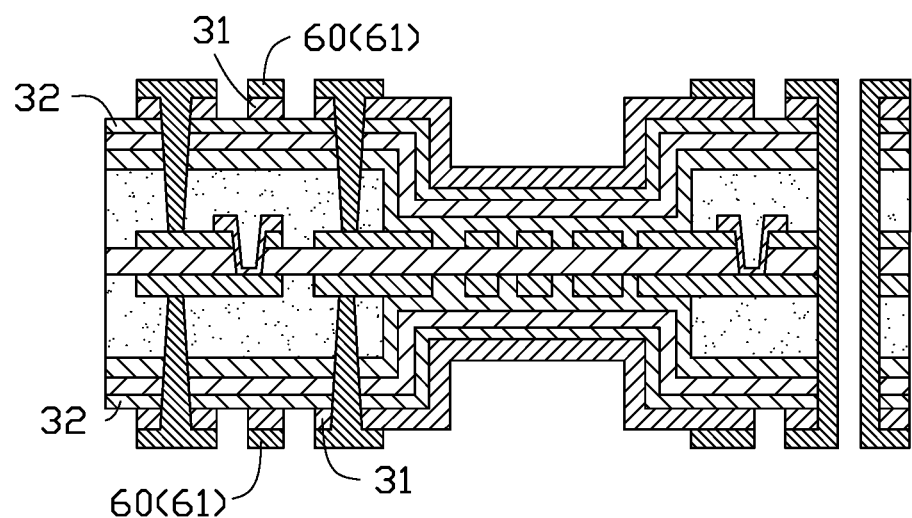
FIG. 8 is a cross-section view of etching a copper layer exposed from the outer circuit layer of FIG. 6.
Figure 9:
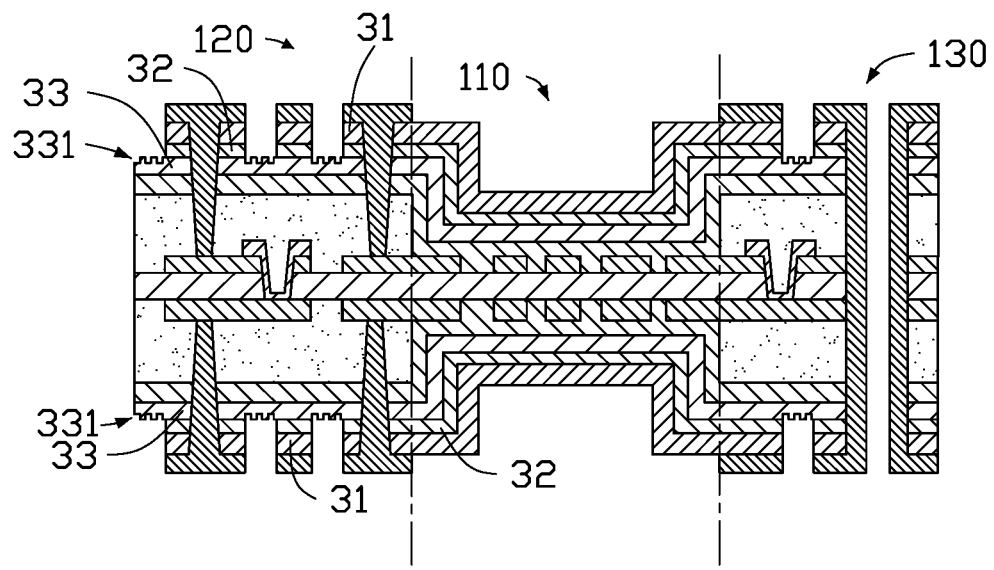
FIG. 9 is a cross-section view of etching two metal seed layers exposed from the outer circuit layers and the copper layers, and etching two flexible dielectric layers exposed from the metal seed layers to form two coarsening surfaces on the flexible dielectric layers.

At block 304, referring to FIGS. 8-9, the copper layers 31 and the metal seed layers 32 exposed from the outer circuit layers 60 are etched, and the flexible dielectric layers 33 exposed from the metal seed layers 32 are etched to form two coarsening surfaces 331. The two coarsening surfaces 331 are located in first rigid area 120 and the second rigid area 130.

In at least one embodiment, the copper layers 31 located in the flexible area 110 are etched.

In other embodiments, only the copper layers 31 exposed from the outer circuit layers 60 and located in the first rigid area 120 and the second rigid area 130 are etched, and the copper layers 31 located in the flexible area 110 are remained.

Figure 10:
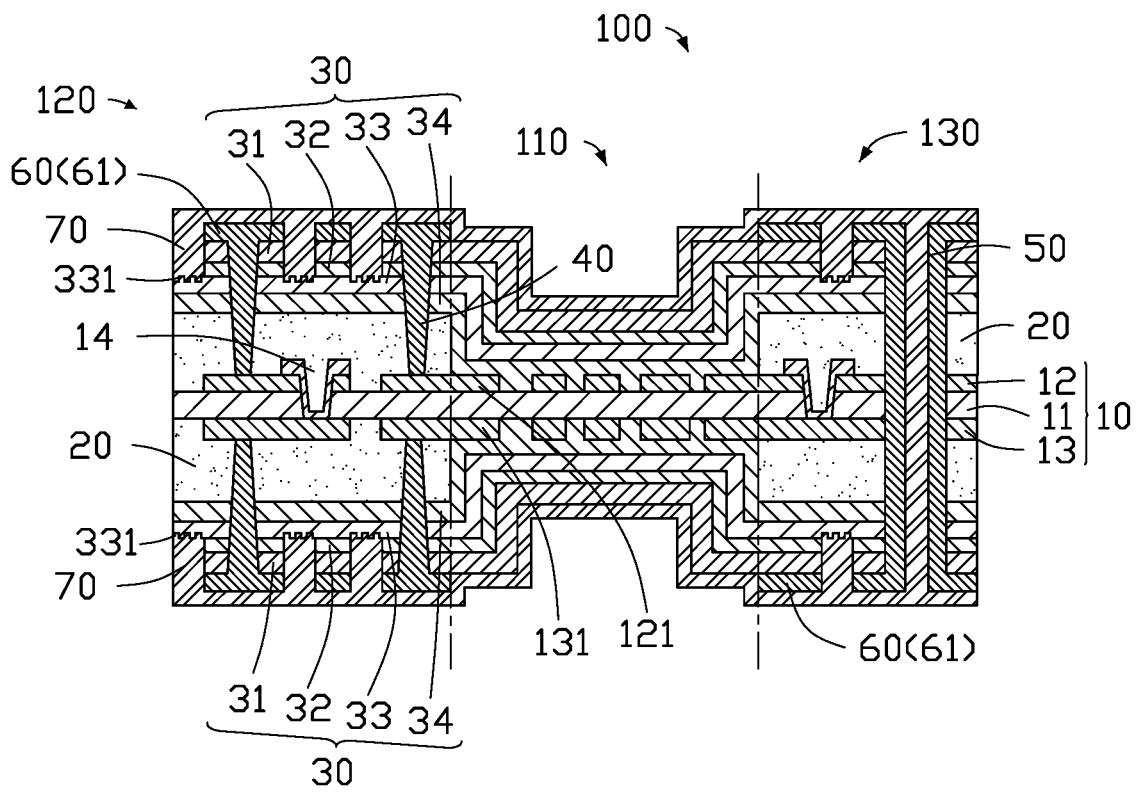
FIG. 10 is a cross-section view of forming a protecting layer on the outer circuit layer and an inner circuit layer in a flexible area of the inner circuit substrate to form the rigid-flex printed circuit board of FIG. 1.

At block 305, referring to FIG. 10, two protecting layers 70 are respectively formed on the two outer circuit layers 60 to form the rigid-flex printed circuit board 100. The two protecting layers 70 are further formed on the copper layers 31 located in the flexible area 110. Each of the two protecting layers 70 are respectively bonded to one of the two coarsening surfaces 331.

In at least one embodiment, materials of the two protecting layers 70 are solder mask.

Referring to FIG. 10, a rigid-flex printed circuit board 100 is provided. The rigid-flex printed circuit board 100 is divided into a flexible area 110, a first rigid area 120, and a second rigid area 130. The first rigid area 120 and the second rigid area 130 are located on two ends of the flexible area 110. The rigid-flex printed circuit board 100 includes an inner circuit substrate 10, two adhesive sheet layers 20, two shielding structures 30, two outer circuit layers 60, and two protecting layers 70. The two adhesive sheet layers 20 are respectively pressed on two opposite surfaces of the inner circuit substrate 10. The two shielding structures 30 are respectively pressed on the two adhesive sheet layers 20 and respectively pressed on two opposite surfaces of the inner circuit substrate 10 located in the flexible area 110. The two outer circuit layers 60 are respectively formed on the shielding structures 30, located in the first rigid area 120 and the second rigid area 130, and electrically connected to the inner circuit substrate 10. The two protecting layers 70 are respectively formed on the two outer circuit layers 60. The two protecting layers 70 are respectively formed on the shielding structures 30 located in the flexible area 110.

In at least one embodiment, the inner circuit substrate 10 includes a substrate layer 11, a first inner circuit layer 12, and a second inner circuit layer 13. The first inner circuit layer 12 and the second inner circuit layer 13 are formed on two opposite surfaces of the substrate layer 11. In other embodiments, the inner circuit substrate 10 may further include more substrate layers and inner circuit layers. One of the adhesive sheet layers 20 is formed on the first inner circuit layer 12 or the second inner circuit layer 13 located in the first rigid area 120 and the second rigid area 130.

The substrate layer 11 is flexible. A material of the substrate layer 11 is selected from at least one of polyimide (PI), polyethylene terephthalate (PET), polyethylene naphthalate (PEN), polyethylene (polyethylene, PE), Teflon, liquid crystal polymer (LCP), polyvinyl chloride polymer (PVC), Ajinomoto Build-up Film (ABF), and other materials. In at least one embodiment, the material of the substrate layer 11 is PI.

The first inner circuit layer 12 includes at least one first inner circuit 121. The second inner circuit layer 13 includes at least one second inner circuit 131.

The inner circuit substrate 10 further includes at least one conductive hole 14 electrically connected to the first inner circuit layer 12 and the second inner circuit layer 13. In at least one embodiment, the conductive hole 14 is a blind conductive hole and penetrates the first inner circuit layer 12 and the substrate layer 11. In other embodiments, the conductive hole 14 may also be a conductive through hole.

Cavities 21 are defined at each of the adhesive sheet layer 20. The cavities 21 penetrate through the adhesive sheet layer 20 and are corresponding to the flexible area 110. The cavities 21 of the adhesive sheet layers 20 are located in the flexible area 110. In at least one embodiment, a material of the adhesive sheet layer 20 is polypropylene (PP).

Each shielding structure 30 includes a copper layer 31, a metal seed layer 32 formed on the copper layer 31, and a flexible dielectric layer 33 formed on the metal seed layer 32, and a backing adhesive sheet layer 34 formed on the flexible medium layer 33. The two backing adhesive sheet layers 34 are respectively pressed on the two adhesive sheet layers 20. The two backing adhesive sheet layers 34 are respectively formed on the first inner circuit layer 12 and the second inner circuit layer 13 located in the flexible area 110. A portion of the backing adhesive sheet layer 34 further formed on an inner wall of the cavity 21 of the adhesive sheet layers 20.

In at least one embodiment, the copper layers 31 are located in the first rigid area 120 and the second rigid area 130.

In at least one embodiment, a thickness of the copper layer 31 is 2 mm to 5 mm.

In at least one embodiment, a material of the metal seed layer 32 is selected from at least one of nickel, chromium, silver, and other metal target materials.

Two coarsening surfaces 331 are respectively formed on the two flexible dielectric layers 33. The two coarsening surfaces 331 are exposed from the metal seed layers 32 and the copper layers 31. The two coarsening surfaces 331 are located in the first rigid area 120 and the second rigid area 130. One of the two protecting layers 70 are bonded to one of the two coarsening surfaces 331 to increase the bonding force between the two protecting layers 70 and the shielding structure 30.

In at least one embodiment, the backing adhesive sheet layer 34 is completely attached to the adhesive sheet layer 20 located in the first rigid area 120 and the second rigid area 130.

A material of the backing adhesive sheet layer 34 may be at least one of resin materials with a good fluidity, such as thermoplastic polyimide (TPI).

The two outer circuit layers 60 are electrically connected to the first inner circuit layer 12 or the second inner circuit layer 13 by at least two conductive blind holes 40.

The two outer circuit layers 60 are electrically connected to each other by at least one conductive through hole 50.

Each outer circuit layer 60 includes at least one outer circuit 61. A thickness of the outer circuit 61 is greater than that of the first inner circuit 121 or greater than that of the second inner circuit 131. A density of the outer circuit 61 is greater than that of the first inner circuit 121 or greater than that the second inner circuit 131. That is, the outer circuit 61 is a thin circuit made of thick copper.

In at least one embodiment, materials of the two protecting layers 70 are solder mask. In other embodiments, the two protecting layers 70 may be cover layers or green paints.

Figure 11:
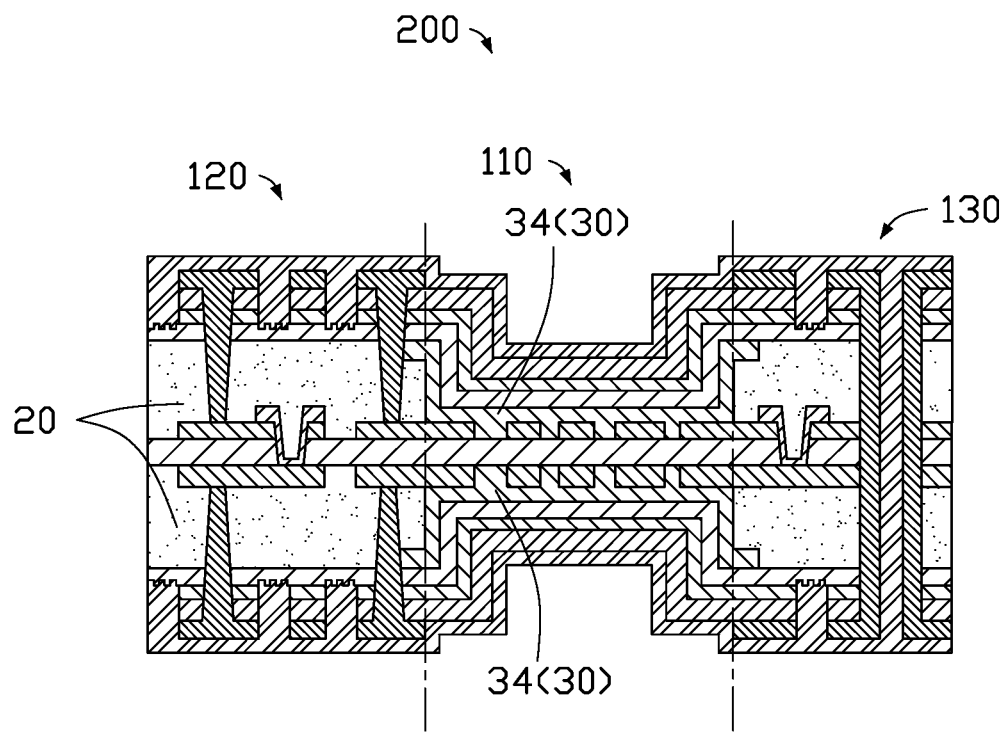
FIG. 11 is a cross-section view of a rigid-flex printed circuit board in a second embodiment.

FIG. 11 shows a second embodiment of a rigid-flex printed circuit board 200. The rigid-flex printed circuit board 200 has a structure that is similar to the structure of the rigid-flex printed circuit board 100. The difference between the rigid-flex printed circuit board 200 and the rigid-flex printed circuit board 100 is that: the backing adhesive sheet layer 34 is partially attached to the adhesive sheet layer 20 located in the first rigid area 120 and the second rigid area 130.

Figure 12:
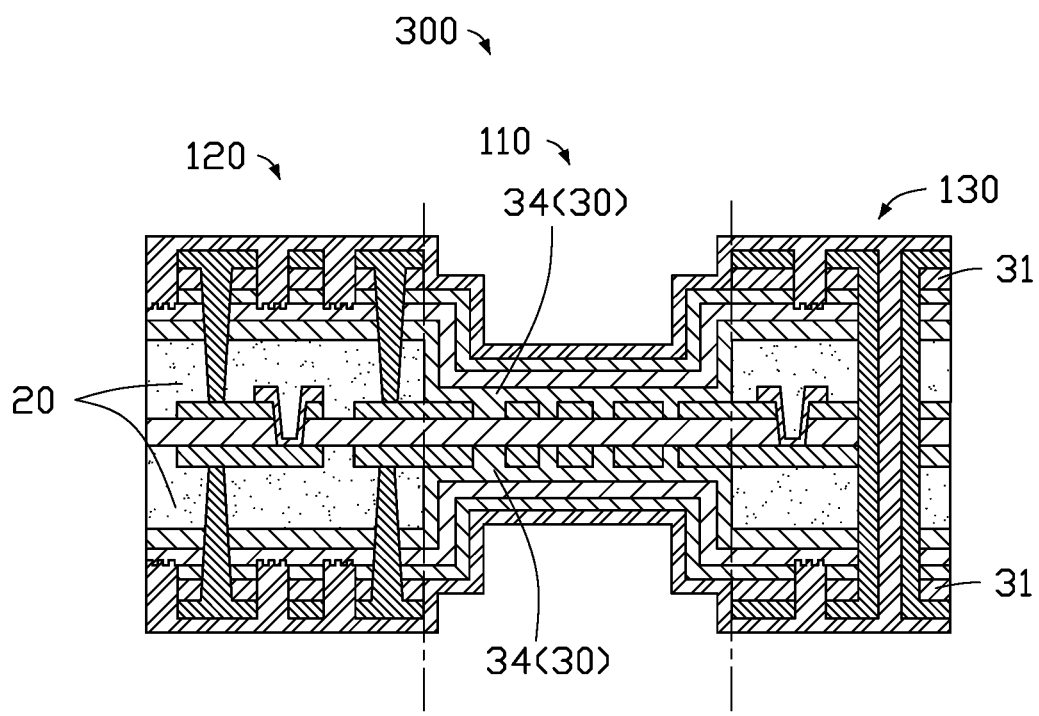
FIG. 12 is a cross-section view of a rigid-flex printed circuit board in a third embodiment.

FIG. 12 shows a second embodiment of a rigid-flex printed circuit board 300. The rigid-flex printed circuit board 300 has a structure that is similar to the structure of the rigid-flex printed circuit board 100. The difference between the rigid-flex printed circuit board 300 and the rigid-flex printed circuit board 100 is that: the copper layers 31 of the rigid-flex printed circuit board 300 are located in the first rigid area 120 and the second rigid area 130. That is, in the flexible area 110, only the metal seed layer 32 has a shielding effect.

With the embodiments described above, the metal seed layer 32 and/or the copper layer 31 as a shielding structure 30 of the rigid-flex printed circuit board 100, 200, and 300, and the shielding structure 30 is formed on the adhesive sheet layer 20, which can reduce the break between the shielding structure and the inner circuit substrate 10, not only reduce a breakage risk of the shielding structure 30, but also save a manufacturing process of the shielding structure 30. Furthermore, the shielding structure 30 only needs to be directly pressed on the inner circuit substrate 10, and does not need to go through punching, sticking, pressing, tearing protective film, baking and other manufacturing processes, so as to simplify the manufacturing process of the shielding structure and reduce the production cost. Besides, the outer circuit layers 60 are formed by selective plating, and the outer circuit layers 60 and the inner circuit layer 12 and 13 are earthed through the conductive blind holes 40, so as to meet common design requirements of power and signal processing. Moreover, the coarsening surfaces 331 on the flexible dielectric layers 33 bonded to the protecting layers 70, which can increase the bonding force between the two protecting layers 70 and the flexible medium layer 33 of the shielding structure 30.

The embodiments shown and described above are only examples. Many details are often found in the art such as the other features of a rigid-flex printed circuit board and a method for manufacturing the same. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A rigid-flex printed circuit board comprising: an inner circuit substrate, wherein the inner circuit substrate comprises a flexible area, a first rigid area, and a second rigid area; the first rigid area and the second rigid area are located on two ends of the flexible area; two adhesive sheet layers formed on two opposite surfaces of the inner circuit substrate, wherein the two adhesive sheet layers are located in the first rigid area and the second rigid area; two shielding structures, wherein each of the two shielding structures comprises a copper layer, a metal seed layer formed on the copper layer, a flexible dielectric layer formed on the metal seed layer, and a backing adhesive sheet layer formed on the flexible dielectric layer; the backing adhesive sheet layer is pressed on the adhesive sheet layer located in the first rigid area and the second rigid area and pressed on the inner circuit substrate located in the flexible area; the metal seed layer is located in the flexible area, the first rigid area, and the second rigid area; the flexible dielectric layer is located in the flexible area, the first rigid area, and the second rigid area; and the backing adhesive sheet layer is located in the flexible area, the first rigid area, and the second rigid area; and two outer circuit layers, wherein each of the two outer circuit layer is formed on the copper layer, located in the first rigid area and the second rigid area, and electrically connected to the inner circuit substrate.

2. The rigid-flex printed circuit board of claim 1, wherein the backing adhesive sheet layer is completely attached to the adhesive sheet layer located in the first rigid area and the second rigid area.

3. The rigid-flex printed circuit board of claim 1, wherein the backing adhesive sheet layer is partially attached to the adhesive sheet layer located in the first rigid area and the second rigid area.

4. The rigid-flex printed circuit board of claim 1, wherein a material of the metal seed layer is selected from at least one of nickel, chromium, and silver.

5. The rigid-flex printed circuit board of claim 1, wherein the copper layer is located in the first rigid area and the second rigid area.

6. The rigid-flex printed circuit board of claim 1, wherein the copper layer is located in the flexible area, the first rigid area, and the second rigid area.

7. The rigid-flex printed circuit board of claim 1, wherein the inner circuit substrate comprises a substrate layer, a first inner circuit layer, and a second inner circuit layer; the first inner circuit layer and the second inner circuit layer are formed on two opposite surfaces of the substrate layer, respectively; one of the two adhesive sheet layers is pressed on the first inner circuit layer or the second inner circuit layer located in the first rigid area and the second rigid area; and the backing adhesive sheet layer is pressed on the first inner circuit layer or the second inner circuit layer located in the flexible area.

8. The rigid-flex printed circuit board of claim 7, wherein each of the two outer circuit layers is electrically connected to the first inner circuit layer or the second inner circuit layer; and the two outer circuit layers are electrically connected to each other.

9. The rigid-flex printed circuit board of claim 7, wherein each of the two outer circuit layers comprises at least one outer circuit; the first inner circuit layer comprises at least one first inner circuit; the second inner circuit layer comprises at least one second inner circuit; a thickness of the outer circuit is greater than that of the first inner circuit or that of the second inner circuit; and a density of the outer circuit is greater than that of the first inner circuit or that of the second inner circuit.

10. The rigid-flex printed circuit board of claim 1, wherein a coarsening surface is defined in each flexible dielectric layer, each of the coarsening surfaces is located in the first rigid area and the second rigid area; the rigid-flex printed circuit board further comprises two protecting layers; the two protecting layers are respectively formed on the two outer circuit layers; the two protecting layers are further respectively formed on two opposite surfaces of the inner circuit substrate located in the flexible area; each of the two protecting layers is bonded to one of the coarsening surfaces.

11. A method for manufacturing a rigid-flex printed circuit board, comprising: providing an inner circuit substrate, two adhesive sheet layers, and two shielding structures; wherein the inner circuit substrate is divided into a flexible area, a first rigid area, and a second rigid area; the first rigid area and the second rigid area are located on two ends of the flexible area; each shielding structure comprises a copper layer, a metal seed layer formed on the copper layer, a flexible dielectric layer formed on the metal seed layer, and a backing adhesive sheet layer formed on the flexible dielectric layer; pressing the two adhesive sheet layers on two opposite surfaces of the inner circuit substrate and pressing the two shielding structures on the two adhesive sheet layers and on the inner circuit substrate located in the flexible area; each of the two backing adhesive sheet layers is pressed on one of the two adhesive sheet layers and pressed on the inner circuit substrate located in the flexible area; and a metal seed layer is located in the flexible area, the first rigid area, and the second rigid area; the flexible dielectric layer is located in the flexible area, the first rigid area, and the second rigid area; and the backing adhesive sheet layer is located in the flexible area, the first rigid area, and the second rigid area; and forming two outer circuit layers on the copper layer by selective plating; wherein each of the two outer circuit layers is located in the first rigid area and the second rigid area and electrically connected to the inner circuit substrate.

12. The method of claim 11, further comprising:
   etching the copper layers and the metal seed layers exposed from the outer circuit layer located in the first rigid area and the second rigid area;
   etching the flexible dielectric layers exposed from the metal seed layers to form two coarsening surfaces on the two flexible dielectric layers; and
   forming two protecting layers on the outer circuit layers and the copper layer located in the flexible area; wherein each of the two protecting layers are bonded to one of the coarsening surfaces.

13. The method of claim 12, when "etching the copper layers and the metal seed layers exposed from the outer circuit layer located in the first rigid area and the second rigid area", further comprising:
   etching the copper layer located in the flexible area.

14. The method of claim 12, wherein the backing adhesive sheet layer is completely attached to the adhesive sheet layer located in the first rigid area and the second rigid area.

15. The method of claim 12, wherein the backing adhesive sheet layer is partially attached to the adhesive sheet layer located in the first rigid area and the second rigid area.

16. The method of claim 12, wherein a material of the metal seed layer is selected from at least one of nickel, chromium, and silver.

17. The method of claim 12, wherein the inner circuit substrate comprises a substrate layer, a first inner circuit layer, and a second inner circuit layer; the first inner circuit layer and the second inner circuit layer are formed on two opposite surfaces of the substrate layer, respectively; one of the two adhesive sheet layers is pressed on the first inner circuit layer or the second inner circuit layer located in the first rigid area and the second rigid area; and the backing adhesive sheet layer is pressed on the first inner circuit layer or the second inner circuit layer located in the flexible area.

18. The method of claim 17, wherein each of the outer circuit layers is electrically connected to the first inner circuit layer or the second inner circuit layer; and the two outer circuit layers are electrically connected to each other.

19. The method of claim 17, wherein each of the two outer circuit layers comprises at least one outer circuit; the first inner circuit layer comprises at least one first inner circuit; the second inner circuit layer comprises at least one second inner circuit; a thickness of the outer circuit is greater than that of the first inner circuit or that of the second inner circuit; and a density of the outer circuit is greater than that of the first inner circuit or that of the second inner circuit.

* * * * *